United States Patent
Barot et al.

(10) Patent No.: US 10,271,422 B2
(45) Date of Patent: Apr. 23, 2019

(54) PRINTED CIRCUIT BOARD FOR REDUCING COMMON MODE CURRENT AND A METHOD THEREOF

(71) Applicant: Hitachi, Ltd., Tokyo (JP)

(72) Inventors: Rohan Barot, Bangalore (IN); K. Ramachandra Sekhar, Bangalore (IN)

(73) Assignee: Hitachi, Ltd., Tokyo (JP)

( * ) Notice: Subject to any disclaimer, the term of this patent is extended or adjusted under 35 U.S.C. 154(b) by 14 days.

(21) Appl. No.: 15/603,554

(22) Filed: May 24, 2017

(65) Prior Publication Data
US 2017/0347445 A1    Nov. 30, 2017

(30) Foreign Application Priority Data

May 30, 2016  (IN) .............................. 201641018555

(51) Int. Cl.
*H05K 1/02*    (2006.01)
*H05K 1/16*    (2006.01)

(52) U.S. Cl.
CPC ........... *H05K 1/0228* (2013.01); *H05K 1/162* (2013.01); *H05K 1/165* (2013.01); *H05K 1/0245* (2013.01); *H05K 2201/09218* (2013.01); *H05K 2201/09672* (2013.01)

(58) Field of Classification Search
CPC ...... H05K 1/0228; H05K 1/162; H05K 1/165; H05K 1/0245; H05K 2201/09672; H01F 27/2804; H01F 41/00
USPC .................................. 333/1, 4, 5, 12; 336/200
See application file for complete search history.

(56) References Cited

U.S. PATENT DOCUMENTS

| 8,305,156 B2 | 11/2012 | Pai et al. |
| 2003/0070833 A1 | 4/2003 | Barth et al. |
| 2008/0309431 A1 | 12/2008 | Hui et al. |
| 2009/0146755 A1 | 6/2009 | Liu et al. |
| 2014/0266505 A1 | 9/2014 | Meyer |

FOREIGN PATENT DOCUMENTS

| CN | 104752018 | * 7/2015 | ............ H01F 17/00 |
| CN | 104752018 A | 7/2015 | |
| EP | 2007009 A2 | 12/2008 | |
| JP | 2006-303209 A | 11/2006 | |
| WO | 2011/114859 A1 | 9/2011 | |

OTHER PUBLICATIONS

Japanese Office Action received in corresponding Japanese Application No. 2017-104013 dated May 18, 2018.

* cited by examiner

*Primary Examiner* — Stephen E. Jones
(74) *Attorney, Agent, or Firm* — Mattingly & Malur, PC (57) ABSTRACT

The present disclosure relates to a PCB and a method in the PCB for reducing common-mode current. The PCB comprises two differential lines and each of the differential lines is on one or more planes of the PCB. The two differential lines carry a differential mode current and the common mode current. The differential mode current and the common mode current may be at least one of a forward current and a backward current. Further, a predefined configuration is formed using each of the two differential lines to generate impedance at the predefined configuration. Here, the predefined configuration is placed close to each other to generate a dielectric capacitance. The flow of the forward current and the backward current in adjacent tracks of each of the two differential lines in the predefined configuration are in opposite direction.

12 Claims, 12 Drawing Sheets

Figure 1

PRIOR ART

Figure 2

PRIOR ART

PRINTED CIRCUIT BOARD FOR REDUCING COMMON MODE CURRENT AND A METHOD THEREOF

FIELD OF THE DISCLOSURE

The present subject matter generally relates to reducing common more current. More particularly, but not exclusively, the present disclosure discloses a Printed Circuit Board (PCB) and a method to reduce the common mode current in the PCB.

BACKGROUND

Advancement in technology of semiconductor devices provisioned to operate the semiconductor devices at higher switching frequencies. Sizes of energy storage elements associated with the semiconductor devices may decrease linearly with increase of switching frequency. Therefore, high density printed circuit demands high switching frequency and faster semiconductor devices. The increase in switching frequency together with increased current slew rates and voltage slew rates i.e., $$\frac{di}{dt} \text{ and } \frac{dv}{dt}$$

respectively, have damaging effects on Electro Magnetic Compatibility (EMC) in the semiconductor devices. These damaging effects have led to deployment of spectrum of conducted and radiated frequencies at higher frequencies in the semiconductor devices. Electro Magnetic Interference (EMI) filter is generally employed to decrease the damaging effects on the EMC. Also, the filter typically has degraded attenuation due to stray elements at high frequencies, and is less effective in filtering out high frequency Electro Magnetic interference (EMI) noises which are generated from the semiconductor devices. Also, such filters use large space on Printed Circuit Board (PCB) that makes it bulky.

Figure 1:
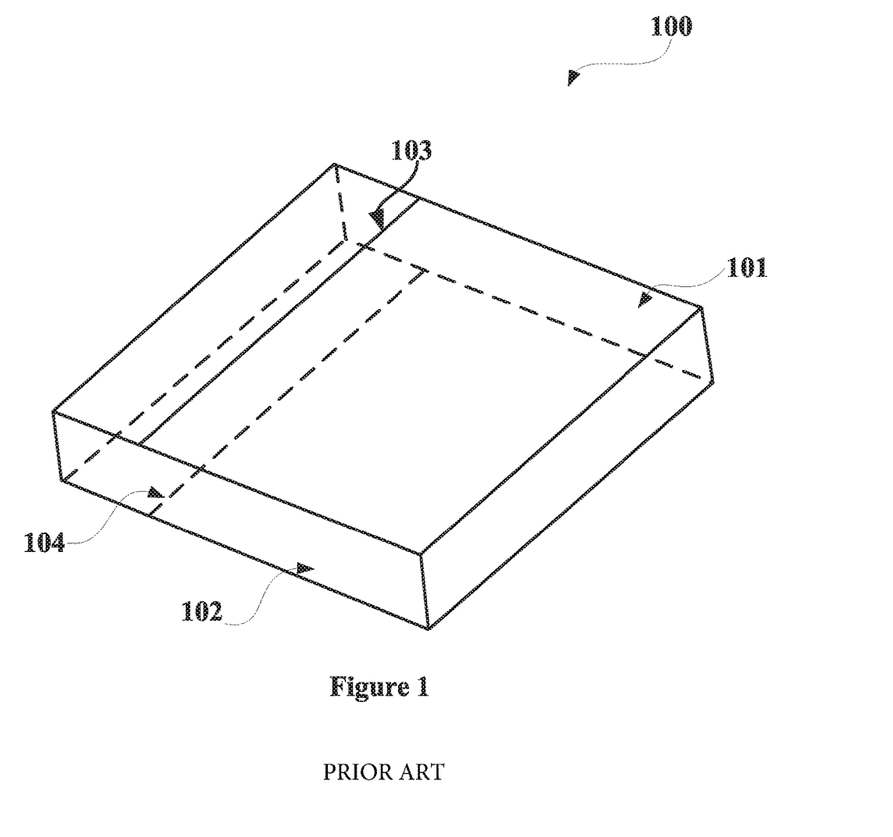
FIG. 1 illustrates a conventional Printed Circuit Board (PCB) with two differential lines.

FIG. 1 illustrates a conventional PCB 100 with two differential lines. The conventional PCB 100 illustrated is a single layered PCB comprising two differential lines namely first differential line 103 and second differential line 104. Each of the two differential lines are placed on different planes, namely first plane 101 and second plane 102 of the PCB 100. The first plane 101 and the second plane 102 are conductive surfaces of the PCB 100. The first differential line 103 is placed on the first plane 101 and the second differential line 104 is placed on the second plane 102. The first differential line 103 carries forward current and the second differential line 104 carries backward current. Further, the forward current and the backward current comprise differential mode current and common mode current. The differential mode current and the common mode current, as the forward current, flow in forward direction in the first differential line 103. Whereas, the differential mode current as the backward current flows in backward direction and the common mode current as the backward current flows in forward direction in the second differential line 104. Thereby, the differential mode current in the differential lines 103 and 104 flow in opposite directions with respect to each other and the common mode currents in the differential lines 103 and 104 flow in same directions with respect to each other. Due to the common mode current, there arises EMI in the PCB and affects the EMC.

Conventional systems in the art disclose one or more techniques for reducing the EMI and increase EMC in the PCBs. One of the techniques includes one or more methods for reducing common mode current by which the EMI is reduced in the PCB. Thereby, the EMC of the PCB is enhanced.

Figure 2:
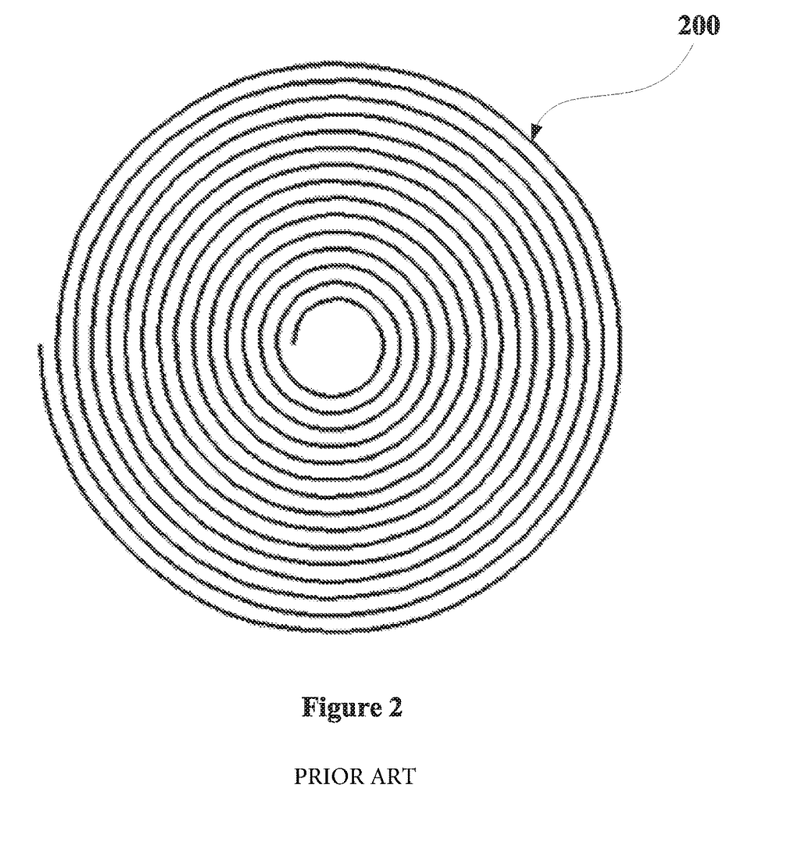
FIG. 2 illustrates spiral structure in a conventional PCB.

One of the methods for reducing the common mode current at the PCB level includes creating hollow geometry on ground plane which is placed adjacent to a signal layer of the PCB. The hollow geometry may be a spiral structure 200 as shown in FIG. 2. The hollow geometry 200, on the ground plane acts like a common-mode choke in the PCB. As described in FIG. 1, the signal layer comprises two differential lines which are placed in a way to create a common mode filter at the PCB. However, due to a dielectric layer placed between the signal layer and the ground layer, stray capacitance is formed and thereby the said method may not be efficient as the efficiency depends upon thickness of dielectric layer.

Another method discloses to reduce common mode current at the PCB level by creating spiral geometry 200 on phase line signal layer and neutral line signal layer of the PCB. In one embodiment, the spiral geometry may be the spiral structure 200 as illustrated in FIG. 2. The said layers are separated using dielectric material which acts as a capacitor filter. Thereby the common mode current is reduced in this method. However, there is a need of ground terminal for reducing common mode current. Further, the hollow space formed due to the spiral structure 200 has dielectric media, which may create inter-winding capacitance and may create several smaller size loops within the spiral structure 200. Also, absence of high permeability in the PCB reduces magnetic flux linkage from phase to neutral which is generated by high frequency common mode current.

In the said methods for reducing the common mode current, inserted loss of the differential mode current due to additional careless spiral structure is higher. The said inserted loss is undesired. Further, to form multiple resonance frequencies into single PCB, there is a need for more number of hollow geometries such as the spiral structure 200. Also, the said method requires copper made ground plane layer which considerably increases cost and size of the PCB. Further, space used for creating a common-mode filter at the PCB level in the said methods is larger.

SUMMARY

Disclosed herein is a method for reducing common-mode current. The PCB comprises two differential lines and each of the differential lines is on one or more planes of the PCB. The two differential lines carry a differential mode current and the common mode current. The differential mode current and the common mode current may be at least one of a forward current and a backward current. Further a predefined configuration is formed using each of the two differential lines to generate impedance at the predefined configuration. Here, the predefined configuration is placed close to each other to generate a dielectric capacitance. The flow of the forward current and the backward current in adjacent tracks of each of the two differential lines in the predefined configuration is in opposite direction.

Embodiments of the present disclosure disclose a method in the PCB for reducing common-mode current. The method comprises generating impedance at a predefined configuration and generating a dielectric capacitance at the predefined configuration. The impedance is formed using each of two differential lines on one or more planes of the PCB. Each of the two differential lines carry a differential mode current and the common mode current and the differential mode current and the common mode current may be at least one of a forward current and a backward current. Flow of the forward current and the backward current in adjacent tracks of each of the two differential lines in the predefined configuration are in opposite direction. Further, the dielectric capacitance is generated by placing the two differential lines close to each other for reducing the common-mode current.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The accompanying drawings, which are incorporated in and constitute a part of this disclosure, illustrate exemplary embodiments and, together with the description, serve to explain the disclosed principles. In the figures, the left-most digit(s) of a reference number identifies the figure in which the reference number first appears. The same numbers are used throughout the figures to reference like features and components. Some embodiments of system and/or methods in accordance with embodiments of the present subject matter are now described, by way of example only, and with reference to the accompanying figures, in which.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and executed by a computer or processor, whether or not such computer or processor is explicitly shown.

DETAILED DESCRIPTION

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however that it is not intended to limit the disclosure to the particular forms disclosed, but on the contrary, the disclosure is to cover all modifications, equivalents, and alternative falling within the scope of the disclosure.

The terms "comprises", "comprising", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or apparatus.

In the following detailed description of the embodiments of the disclosure, reference is made to the accompanying drawings that form a part hereof, and in which are shown by way of illustration specific embodiments in which the disclosure may be practiced. These embodiments are described in sufficient detail to enable those skilled in the art to practice the disclosure, and it is to be understood that other embodiments may be utilized and that changes may be made without departing from the scope of the present disclosure. The following description is, therefore, not to be taken in a limiting sense.

The present disclosure relates to a less-bulky and cost-effective PCB for reducing common mode current. The present disclosure aims to reduce EMI and enhance EMC in the PCB by reducing the common mode current. The common mode current is reduced by generating an impedance to restrict flow of the common mode current and by generating dielectric capacitance for allowing the common mode current to flow back to source of the common mode current. In the present disclosure, the PCB comprises two differential lines and each of the differential lines is on one or more planes of the PCB. The two differential lines carry a differential mode current and the common mode current. The differential mode current and the common mode current may be at least one of a forward current and a backward current. Further, a predefined configuration is formed using each of the two differential lines to generate the impedance and the predefined configuration is placed close to each other to generate the dielectric capacitance. The flow of the forward current and the backward current in adjacent tracks of each of the two differential lines in the predefined configuration are in opposite direction.

Figure 3:
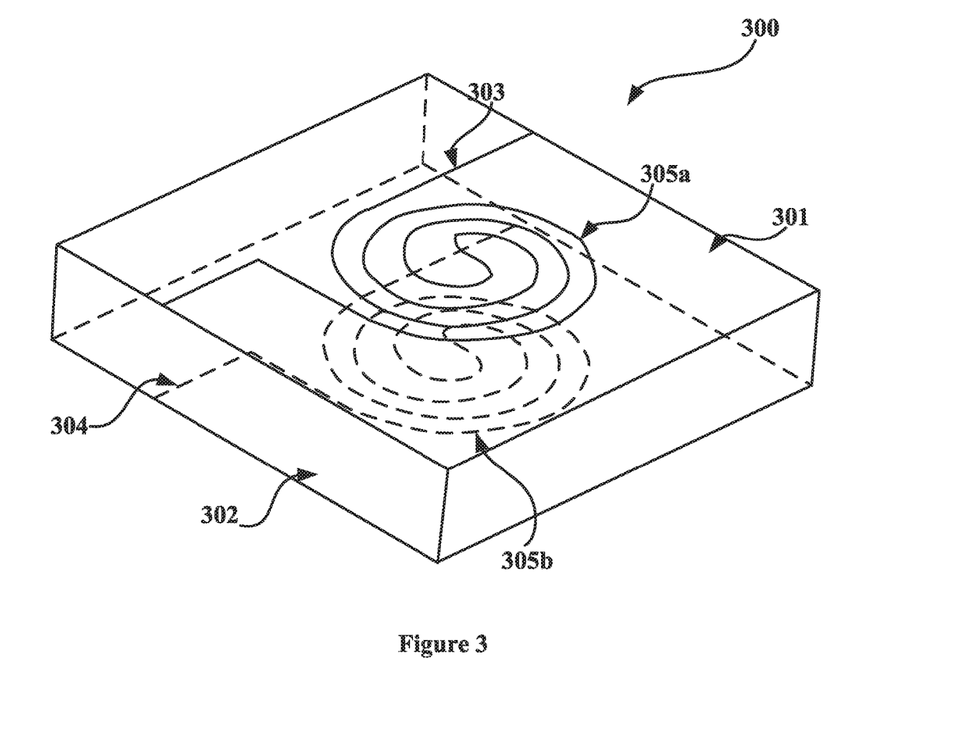
FIG. 3 illustrates a PCB with a predefined configuration of each of two differential lines in accordance with some embodiments of the present disclosure.

FIG. 3 illustrates a PCB 300 with a predefined configuration 305 of each of two differential lines in accordance with some embodiments of the present disclosure. The PCB 300 illustrated is a single layered PCB comprising two differential lines namely first differential line 303 and second differential line 304. In non-limiting embodiment, the PCB 300 may comprise one of single layer, double layer and multiple layers. Each of the two differential lines 303 and 304 may be placed on one or more planes of the PCB. In one embodiment, the differential lines 303 and 304 are placed on different planes, namely first plane 301 and second plane 302 as shown in FIG. 3. The first plane 301 and the second plane 302 are conductive surfaces of the PCB 300. In one of non-limiting embodiments, for the PCB comprising one of double layer and multiple layers, distance between two adjacent layers of the PCB 300 may be in range of 1 mm to 1.5 mm. The first differential line 303 is placed on the first plane 301 and the second differential line 304 is placed on the second plane 302. In an exemplary embodiment, the differential lines are made up of conductive material such as copper. However, any other conductive material can be used with the present disclosure.

The first differential line 303 carries forward current and the second differential line 304 carries backward current. Further, the forward current and the backward current comprise differential current and common mode current. In one embodiment, the second differential line may be referred as a neutral line. The differential mode current and the common mode current, as the forward current, flow in forward direction in the first differential line 303. Whereas, the differential mode current as the backward current flows in backward direction and the common mode current as the backward current flows in forward direction in the second differential line 304. Thereby, the differential mode current in the differential lines 303 and 304 flow in opposite directions with respect to each other and the common mode current in the differential lines 303 and 304 flow in same directions with respect to each other. Further, each of the differential lines 303 and 304 comprise a predefined configuration. The predefined configuration associated with the first differential line 303 may be a first predefined configuration 305a and the predefined configuration associated with the second differential line 304 may be a second predefined configuration 305b.

Figure 4A:
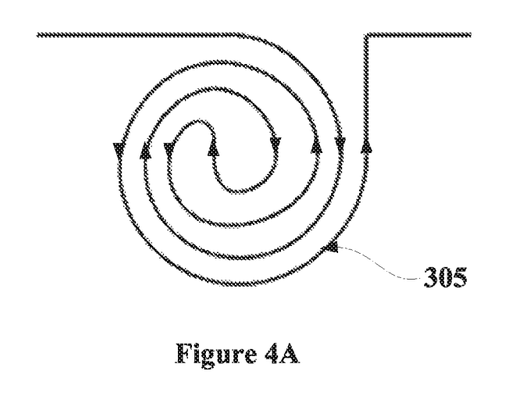
FIG. 4A illustrates a predefined configuration of the differential lines of a PCB in accordance with some embodiments of the present disclosure.

In the embodiment, the first predefined configuration 305a and the second predefined configuration 305b may be a spiral structure 305 as shown in FIG. 4A. The predefined configuration 305 is defined in such a way that one of the forward current and the backward current flowing in adjacent tracks of the differential lines 303 and 304 at the predefined configuration 305a and 305b are of opposite direction as illustrated in FIG. 4A. In the first predefined configuration, the forward current flowing in the adjacent tracks of the first differential line 303 is of opposite direction. In the second predefined configuration, the forward current flowing in the adjacent tracks of the second differential line 304 is of opposite direction. The predefined configuration 305 in the differential lines 303 and 304 generates impendence in the differential lines 303 and 304. The generated impedance restricts flow of the common mode current beyond the predefined configuration 305 in each of the differential lines 303 and 304. In one of non-limiting embodiments, diameter of the predefined configuration 305 may be approximately 12 mm, number of turns in the predefined configuration 305 may be 4, length of tracks of the differential lines 303 and 304 at the predefined configuration 305 may be approximately 6 mm and spacing between the adjacent tracks at the predefined configuration 305 may be approximately 1 mm.

Numerical values specified in the present disclosure are for exemplary means to describe the present disclosure. Any deviation in the numerical values that configures the PCB as disclosed in the present disclosure i.e., to generate the impedance for restricting flow of the common mode current and the dielectric capacitance for allowing the current mode current to flow as the backward current will fall within the scope of the present disclosure.

Figure 5A:
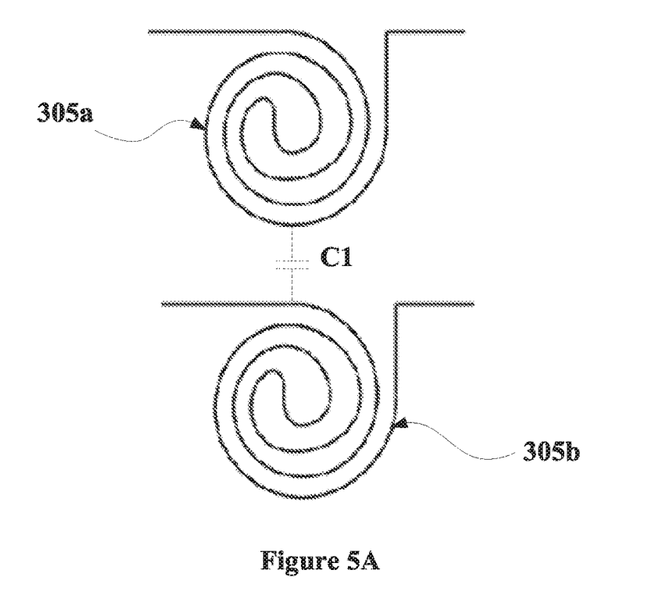
FIG. 5A illustrates arrangement of the predefined configurations in a PCB in accordance with some embodiments of the present disclosure.

Further, an arrangement of the first predefined configured 305a and the second predefined configuration 305b is provided such that the first predefined configured 305a and the second predefined configuration 305b are placed close to each other. In one embodiment, the arrangement may be placing the first predefined configuration 305a and the second predefined configuration 305b parallel to each other as illustrated in FIG. 5A. In one embodiment, there may be an insulating material (not shown in figure) placed between the first predefined configuration 305a and the second predefined configuration 305b. Such arrangement with the first predefined configuration 305a and the second predefined configuration 305b generates dielectric capacitance C1 as shown in FIG. 54. Here, the dielectric capacitance C1 allows the common mode current to flow as the backward current in the second differential line 304. Therefore, due to the restriction of the common mode current and allowing the common current to flow as the backward current, the common mode current is passed back to source of the common mode current and avoided to pass to circuitry associated with the PCB 300. The differential mode current is passed to the circuitry. Thereby, the EMI in the PCB 300 is reduced and the EMC is enhanced.

Figure 4B:
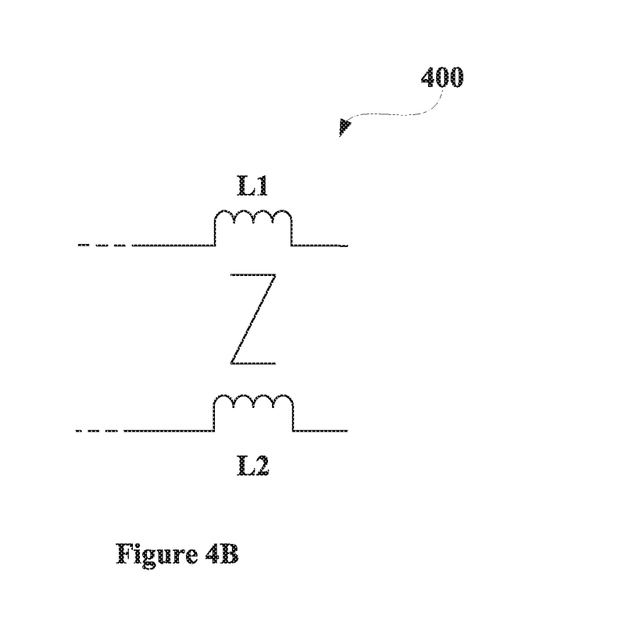
FIG. 4B shows an equivalent circuit of a predefined configuration shown in FIG. 4A in accordance with some embodiments of the present disclosure.

FIG. 4B shows an equivalent circuit of the predefined configuration 305 shown in FIG. 44 in accordance with some embodiments of the present disclosure. L1 is first inductance generated due to the first predefined configuration 305a and L2 is second inductance generated due to the second predefined configuration 305b. The common mode current flowing through the differential lines 303 and 304 are of high frequency and same phase. Therefore, the magnetic flux generated into the predefined configurations 305a and 305b is added up. However, the differential mode current flowing through the differential lines 303 and 304 is 180 degree phase shifted with respect to each other. Therefore, the magnetic flux generated into the predefined configurations 305a and 305b due to the differential mode current is cancelled out. Thereby, the first predefined configuration 305a acting as the first inductance L1 and the second predefined configuration acting as the second inductance L2, offers the impedance to the common-mode current without loss of the differential mode current. Hence, the said impedance restricts flow of the common mode current beyond the predefined configurations 305a and 305b.

Further, in the present disclosure, stray capacitance (not shown in figure) may be formed between the adjacent tracks of the differential lines 303 and 304 at their respective predefined configurations. Inductance of each of the adjacent tracks forms resonance with the corresponding stray capacitance at one of multiple resonating frequencies. Here, the stray capacitance may vary depending upon configurations such as, but not limited to, placement of the adjacent tracks, spacing between the adjacent tracks, spacing between layers of the PCB and frequency component of common mode current. Therefore, multiple resonating frequencies may be achieved by varying the configurations by which the common mode current with a specific frequency may be reduced.

Figure 5B:
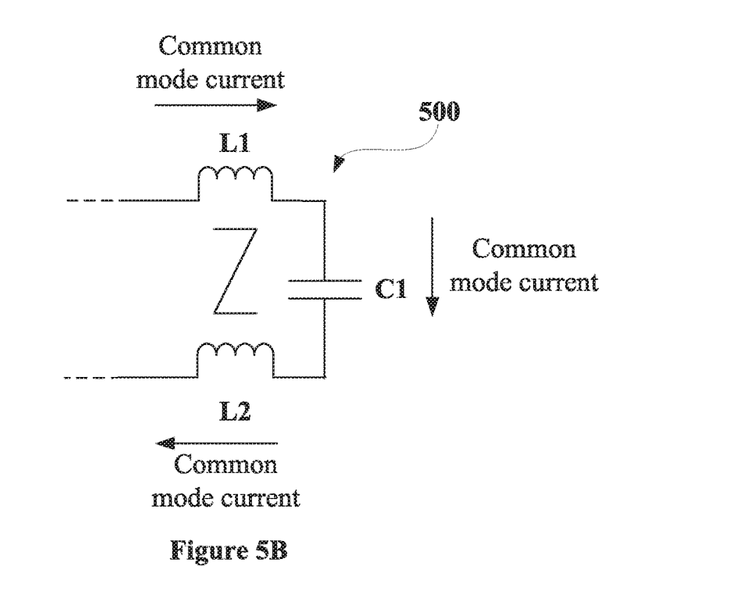
FIG. 5B shows an equivalent circuit of arrangement of predefined configurations shown in FIG. 5A in accordance with some embodiments of the present disclosure.

Figure SB shows an equivalent circuit of arrangement of the predefined configurations 305a and 305b shown in FIG. 5A in accordance with some embodiments of the present disclosure. As described, due to the first inductance L1 and the second inductance L2, the impedance is generated at the predefined configurations 305a and 305b which restricts the flow of the common mode current. Further, due to the arrangement of the first predefined configuration 305a and the second predefined configuration 305b, the dielectric capacitance C1 is formed between the predefined configurations 305a and 305b. Depending upon dielectric constant value between the predefined configurations 305a and 305b, value of the dielectric capacitance C1 varies. The dielectric capacitance C1 provides a low impedance path to the common mode current which is of the high frequency and allows the common mode current to flow back to the source. This arrangement reduces the common mode current by minimizing loop for the common mode current in the PCB 300 by creating a common mode filter structure.

Figure 6A:
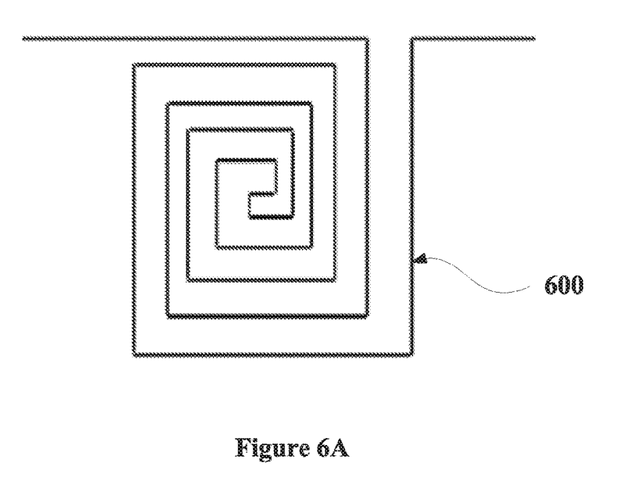
FIG. 6A illustrates an exemplary embodiment of predefined configuration in a PCB in accordance with some embodiments of the present disclosure.
Figure 6B:
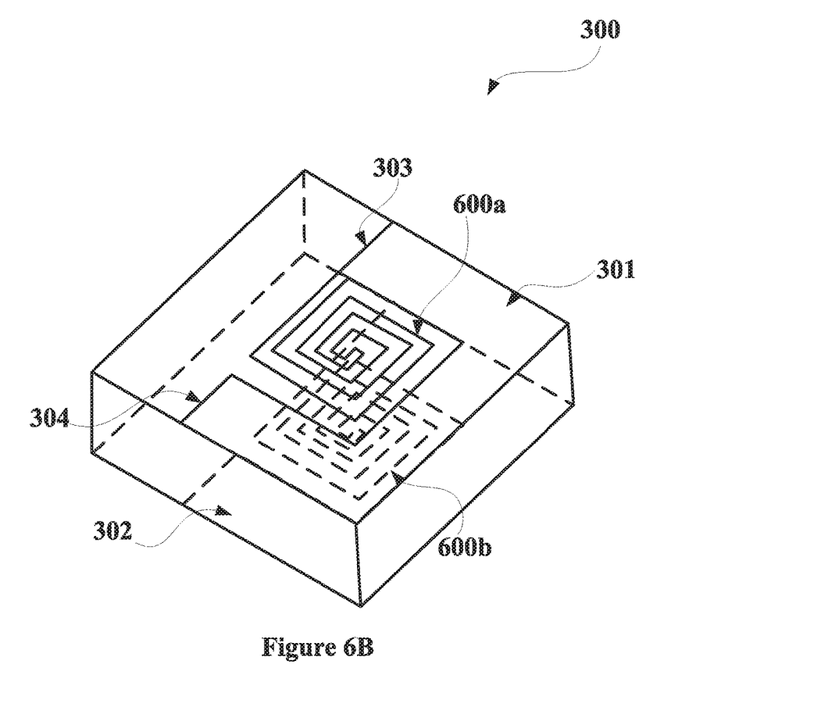
FIG. 6B illustrates a PCB with a predefined configuration illustrated in FIG. 6A in accordance with some embodiments of the present disclosure.

FIG. 6A illustrates an exemplary embodiment of predefined configuration in a PCB in accordance with some embodiments of the present disclosure. FIG. 6B illustrates a PCB with the predefined configuration illustrated in FIG. 6A in accordance with some embodiments of the present disclosure.

Here, the predefined configuration 600 is of a square structure. The predefined configuration associated with the first differential line 303 is a first predefined configuration 600a and the predefined configuration associated with the second differential line 304 is a second predefined configuration 600b. The predefined configuration 600 is defined in such a way that the forward current flowing in adjacent tracks of the first differential line 303 at the first predefined configuration 600a are opposite direction and the backward current flowing in adjacent tracks of the second differential line 304 at the second predefined configuration 600b are opposite direction.

Figure 7A:
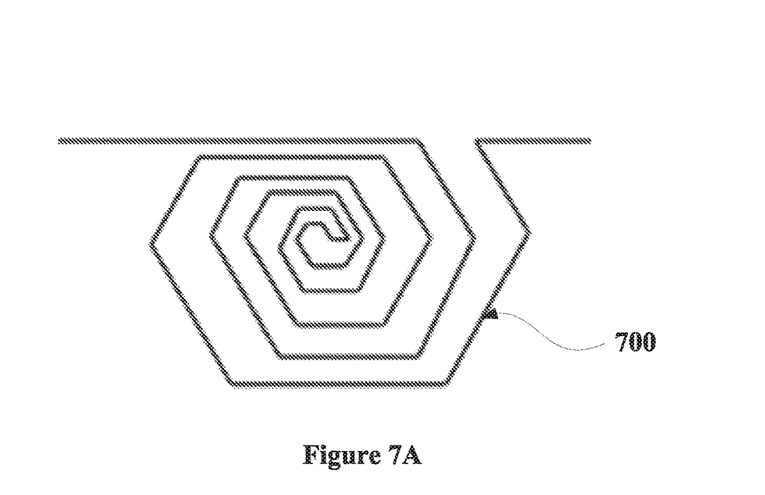
FIG. 7A illustrates an exemplary embodiment of predefined configuration in a PCB in accordance with some embodiments of the present disclosure.
Figure 7B:
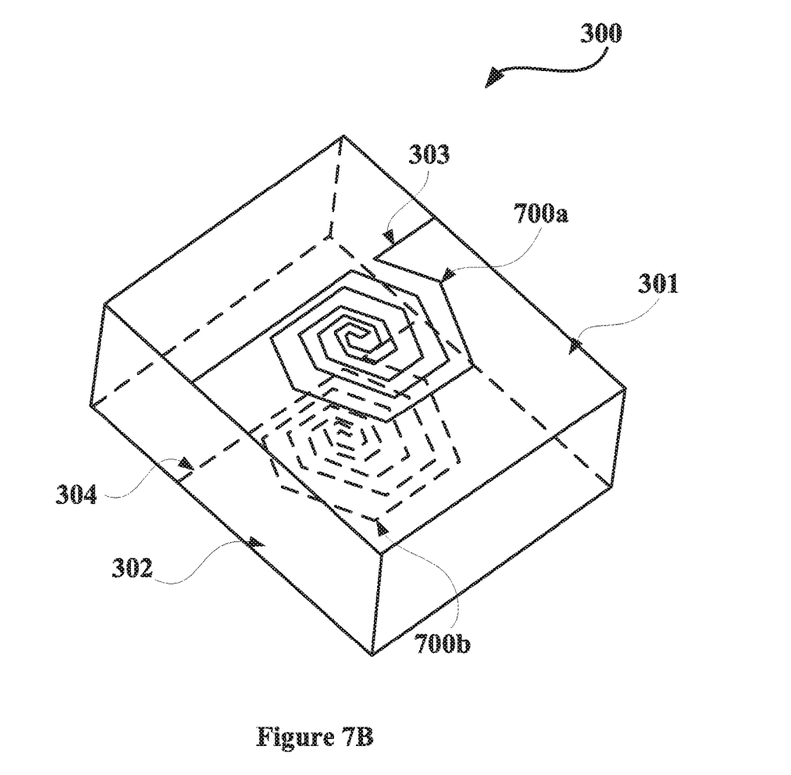
FIG. 7B illustrates a PCB with a predefined configuration illustrated in FIG. 7A in accordance with some embodiments of the present disclosure.

FIG. 74 illustrates an exemplary embodiment of predefined configuration in a PCB in accordance with some embodiments of the present disclosure. FIG. 7B illustrates the PCB with the predefined configuration illustrated in FIG. 74 in accordance with some embodiments of the present disclosure.

Here, the predefined configuration 700 is of a hexagon structure. The predefined configuration associated with the first differential line 303 is a first predefined configuration 700a and the predefined configuration associated with the second differential line 304 is a second predefined configuration 700b. The predefined configuration 700 is defined in such a way that the forward current flowing in adjacent tracks of the first differential line 303 at the first predefined configuration 700a are in opposite direction and the backward current flowing in adjacent tracks of the second differential line 304 at the second predefined configuration 700b are in opposite direction.

As described with respect to FIG. 3, in the PCBs illustrated in FIGS. 6B and 7B, the predefined configurations respectively generate impedance to the common mode current in the PCB and the arrangement of the predefined configurations generate dielectric capacitance C1 by which the common mode current flows back to the source. Thereby, the common mode current is reduced to reduce the EMI and EMC in the PCB.

The predefined configuration as disclosed in the present disclosure is only exemplary embodiments. Various other embodiments would still fall within the scope of the following disclosure, provided flow of the forward current and the backward current in adjacent tracks of each of the two differential lines in the predefined configuration are in opposite direction.

Figure 8:
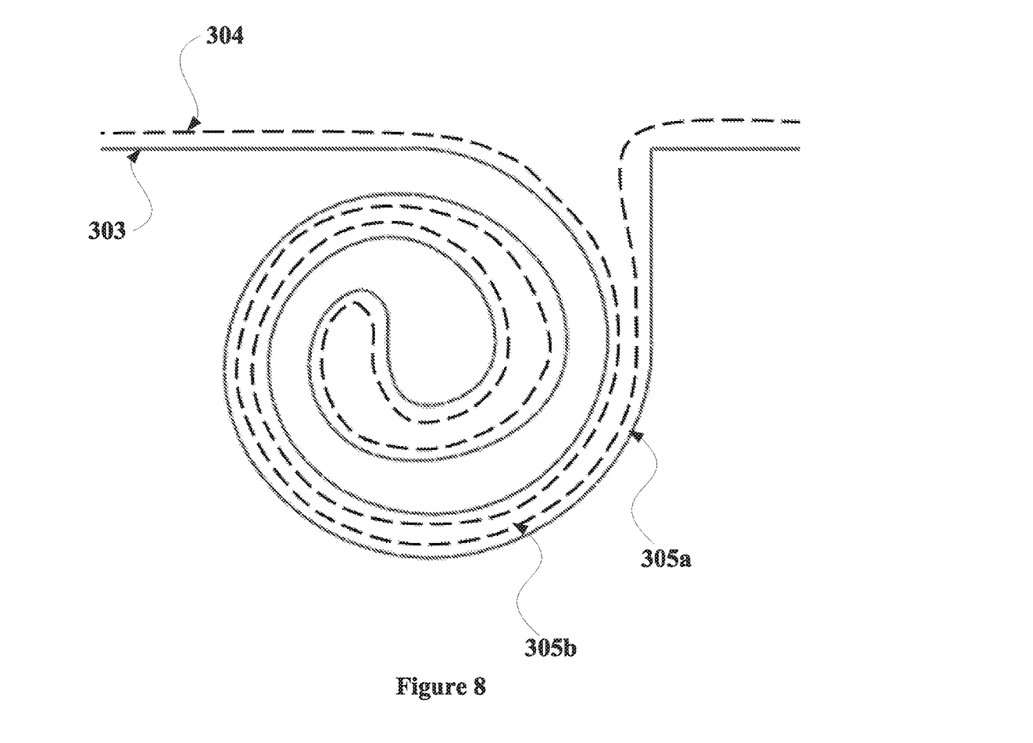
FIG. 8 illustrates an exemplary embodiment of arrangement of predefined configurations in a PCB in accordance with some embodiments of the present disclosure.

FIG. 8 illustrates an exemplary embodiment of arrangement of predefined configurations 305a and 305b in the PCB 300 in accordance with some embodiments of the present disclosure. The differential lines may be placed adjacent to each as shown in FIG. 8. The predefined configurations 305a and 305b are also placed adjacent and close to each other to generate the dielectric capacitor C1. By the generated dielectric capacitance C1 and inductance L1 and L2, the common mode current may be reduced in the PCB.

Further, the PCB as disclosed in the present disclosure with any of the embodiments described in the detailed description of the present disclosure constitutes a novel hardware.

Figure 9:
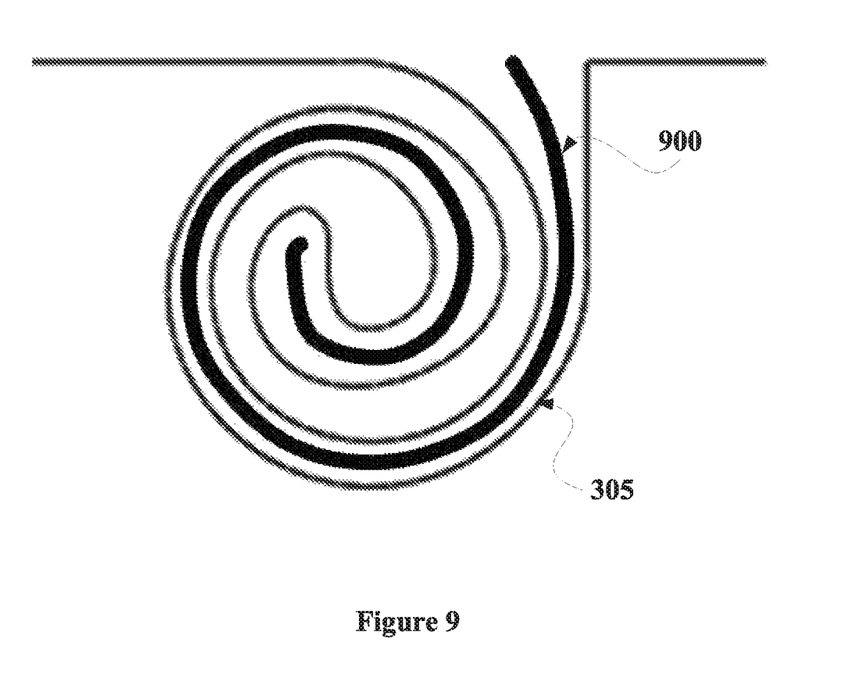
FIG. 9 illustrates forming of common mode choke in a PCB in accordance with some embodiments of the present disclosure.

FIG. 9 illustrates forming of common mode choke in the PCB 300 in accordance with some embodiments of the present disclosure. A permeable material 900 may be used for forming the common mode choke in the PCB 300. The common mode choke is formed for further filtering of the common mode current without de-rating the PCB under high currents and without causing signal degradation in the PCB.

Figure 10:
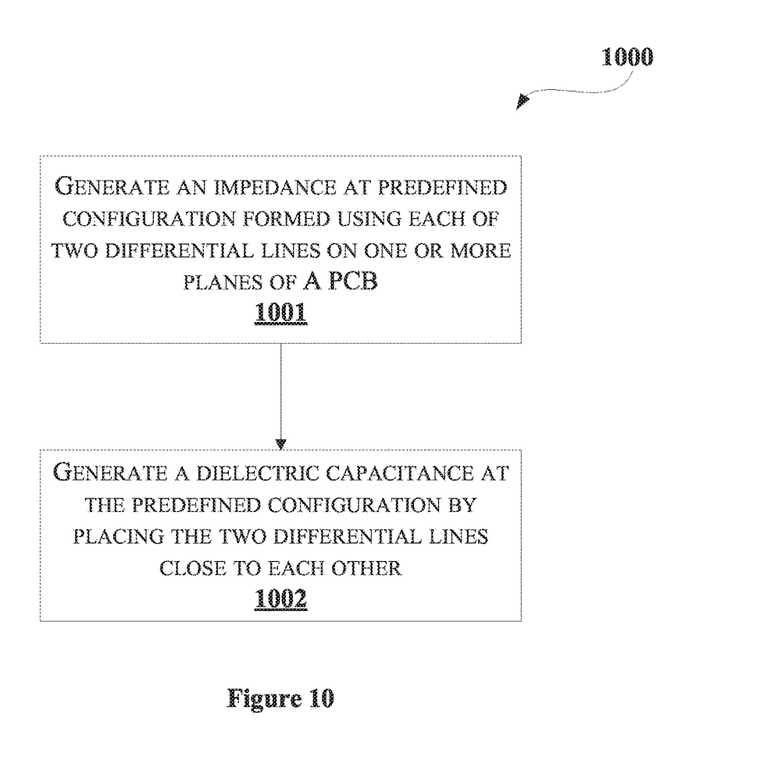
FIG. 10 illustrates a flow diagram showing steps performed to reduce common mode current in a PCB in accordance with some embodiments of the present disclosure.

FIG. 10 illustrates a flow diagram showing steps performed to reduce common mode current in a PCB in accordance with some embodiments of the present disclosure.

As illustrated in FIG. 10, the method comprises one or more blocks for reducing common mode current in the PCB.

The order in which the method is described is not intended to be construed as a limitation, and any number of the described method blocks can be combined in any order to implement the method. Additionally, individual blocks may be deleted from the methods without departing from the scope of the subject matter described herein. Furthermore, the method can be implemented in any suitable hardware, software, firmware, or combination thereof.

At block 1001, the impedance is generated by forming the predefined configuration using each of the two differential lines 303 and 304 on one or more planes of the PCB 300. Each of the two differential lines carry the differential mode current and the common mode current. The differential mode current and the common mode current may be at least one of the forward current and the backward current. Flow of the forward current and the backward current in adjacent tracks of each of the two differential lines in the predefined configuration are in opposite direction. The impedance restricts the flow of the common mode current beyond the predefined configuration in each of the differential lines.

At block 1002, the dielectric capacitance C1 is generated by placing the two differential lines close to each other. The dielectric capacitance allows the common mode current to flow as the backward current.

In one embodiment, simulation of the PCB of the present disclosure and a conventional PCB may be performed to compare the PCB of the present disclosure with the conventional PCB. Insertion loss and radiation emission the PCB of the present disclosure and the conventional PCB are obtained from the simulation.

Figure 11:
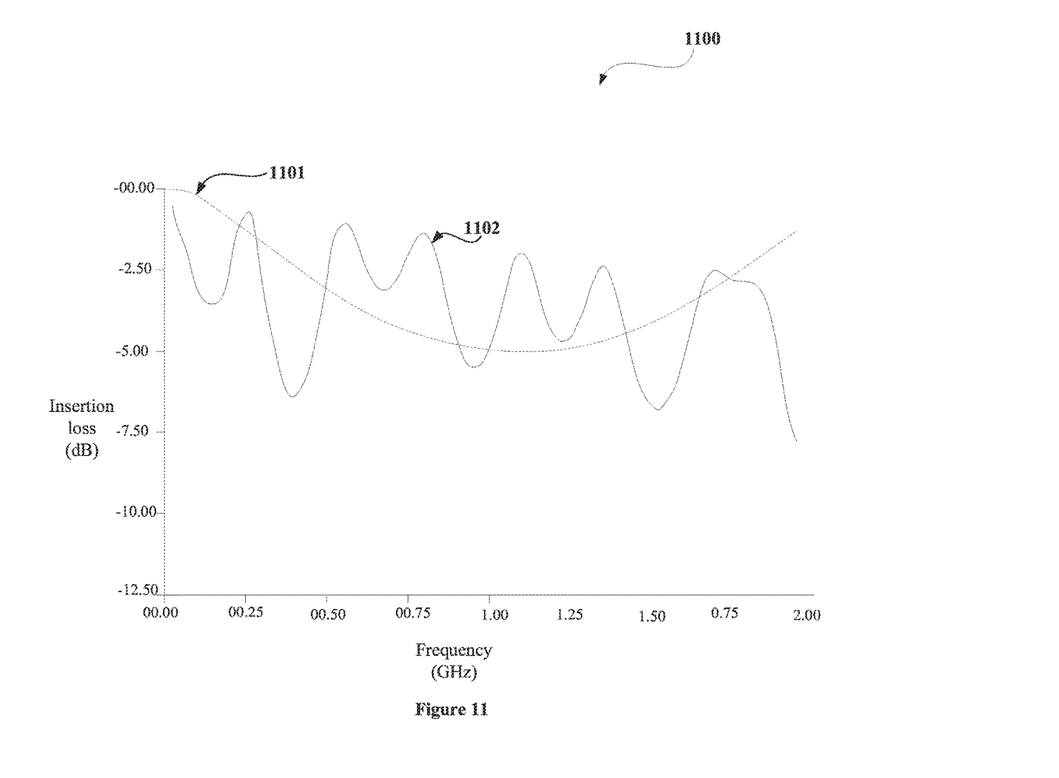
FIG. 11 shows a graph indicating insertion loss in conventional PCB and PCB in accordance with some embodiments of the present disclosure.

FIG. 11 shows a graph 1100 indicating the insertion loss in the conventional PCB and the PCB in accordance with some embodiments of the present disclosure.

The insertion loss defines power loss in the differential line of a PCB. The loss may be due to presence of impedance from source to load of the PCB. If the insertion loss is below 10 db for low frequency differential mode current, then the functionality of the PCB may not disturbed. Therefore, the insertion loss to be below 10 dB is desirable. From the graph in FIG. 11, the PCB of the present disclosure shows larger length of tracks than the conventional PCB. Therefore, the insertion loss 1102 of the differential mode current in the PCB of the present disclosure may go up when compared to insertion loss 1101 in conventional PCB but stays within 10 db which is desirable.

Also, from the graph in FIG. 11, the insertion loss 1101 for the common mode current in the conventional PCB is observed to not to form a resonance frequency. Therefore, common mode current in the conventional PCB may not be reduced. Whereas in the PCB of the present invention, resonance frequency is formed at 0.25 GHz, 0.55 GHz, 0.80 GHz and so on, at which the common mode current may be reduced.

Figure 12:
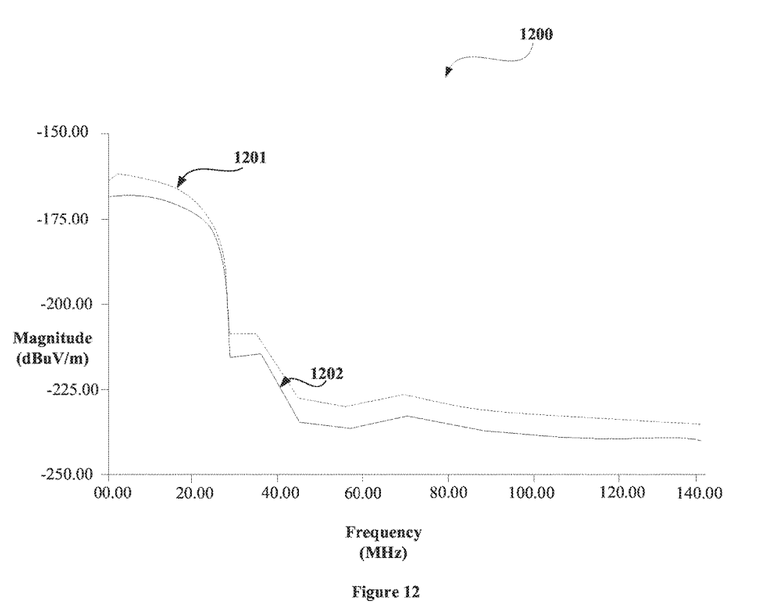
FIG. 12 shows a graph indicating radiative emission in conventional PCB and PCB in accordance with some embodiments of the present disclosure.

FIG. 12 shows a graph 1200 indicating the radiative emission in the conventional PCB and the PCB in accordance with some embodiments of the present disclosure.

Radiated emission is because of the common mode current carried by the differential lines. Lower radiated emission is desired in a PCB. From the graph in FIG. 12, the radiated emission 1202 is observed to be reduced by more than 10 dB u V/m in the PCB of the present disclosure when compared to the radiated emission 1201 of the conventional PCB.

From the simulations performed, the PCB of the present disclosure is desirable when compared to the conventional PCB.

Embodiments of the present disclosure disclose a predefined configuration by which differential mode current loss is minimal.

Embodiments of the present disclosure avoid necessity of mounting peripheral EMI filter, thereby reducing size and weight of PCB.

Embodiments of the present disclosure eliminate the need of an additional ground wire or terminal to reduce common-mode current.

Embodiments of the present disclosure eliminate the need of externally mounted common mode current filter.

Embodiments of the present disclosure form various resonances at several different frequencies to offer low impedance to common mode current and thus allowing the common mode current to flow back to source.

Embodiments of the present disclosure provisions to modify arrangement based on the radiated emission frequency peak to generate resonance at same frequency as that of the common mode current.

Embodiments of the present disclosure eliminate implementation of external ferrite cores or mounted common-mode filters because of lower radiated emission.

The described operations may be implemented as a method, system or article of manufacture using standard programming and/or engineering techniques to produce software, firmware, hardware, or any combination thereof. The described operations may be implemented as code maintained in a "non-transitory computer readable medium", where a processor may read and execute the code from the computer readable medium. The processor is at least one of a microprocessor and a processor capable of processing and executing the queries. A non-transitory computer readable medium may comprise media such as magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), etc. Further, non-transitory computer-readable media comprise all computer-readable media except for a transitory. The code implementing the described operations may further be implemented in hardware logic (e.g., an integrated circuit chip, Programmable Gate Array (PGA), Application Specific Integrated Circuit (ASIC), etc.).

Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The transmission signals in which the code or logic is encoded is capable of being transmitted by a transmitting station and received by a receiving station, where the code or logic encoded in the transmission signal may be decoded and stored in hardware or a non-transitory computer readable medium at the receiving and transmitting stations or devices. An "article of manufacture" comprises non-transitory computer readable medium, hardware logic, and/or transmission signals in which code may be implemented. A device in which the code implementing the described embodiments of operations is encoded may comprise a computer readable medium or hardware logic. Of course, those skilled in the art will recognize that many modifications may be made to this configuration without departing from the scope of the invention, and that the article of manufacture may comprise suitable information bearing medium known in the art.

The terms "an embodiment", "embodiment", "embodiments", "the embodiment", "the embodiments", "one or more embodiments", "some embodiments", and "one embodiment" mean "one or more (but not all) embodiments of the invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

A description of an embodiment with several components in communication with each other does not imply that all such components are required. On the contrary a variety of optional components are described to illustrate the wide variety of possible embodiments of the invention.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

The illustrated operations of FIG. 10 show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the disclosure of the embodiments of the invention is intended to be illustrative, but not limiting, of the scope of the invention, which is set forth in the following claims.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

REFERRAL NUMERALS

| Reference Number | Description |
| --- | --- |
| 100 | Conventional PCB |
| 101 | First Plane of Conventional PCB |
| 102 | Second Plane of Conventional PCB |
| 103 | First Differential Line |
| 104 | Second Differential Line |
| 200 | Spiral Structure in Conventional PCB |
| 300 | PCB of Present Disclosure |
| 301 | First Plane of PCB |
| 302 | Second Plane of PCB |
| 303 | First Differential Line |
| 304 | Second Differential Line |
| 305a | First Predefined Configuration |
| 305b | Second Predefined Configuration |
| 400 | Equivalent Circuit of Predefined Configuration |
| 500 | Equivalent Circuit of Arrangement of Predefined Configurations |
| 600 | Embodiment of Predefined Configuration |
| 600a | First Predefined Configuration |
| 600b | Second Predefined Configuration |
| 700 | Embodiment of Predefined Configuration |
| 700a | First Predefined Configuration |
| 700b | Second Predefined Configuration |
| 900 | Permeable Material |

We claim:

1. A printed circuit board (PCB) for reducing a common-mode current, comprising:
    first and second differential lines, the first differential line on a first plane of the PCB and the second differential line a second plane of the PCB different than the first plane, carrying a differential mode current and the common mode current, the differential mode current and the common mode current being at least one of a forward current and a backward current,
    wherein the first and second differential lines are disposed in a predefined configuration, generate an impedance at the predefined configuration and generate a dielectric capacitance, and
    wherein flow of the forward current in adjacent tracks of each of the first and second differential lines in the predefined configuration are in opposite directions, and
    wherein flow of the backward current in adjacent tracks of each of the first and second differential lines in the predefined configuration are in opposite directions.

2. The PCB as claimed in claim 1, wherein a permeable material is placed between the adjacent tracks of at least one of the first and second differential lines to form a common mode choke.

3. The PCB as claimed in claim 1, wherein the impedance restricts flow of the common-mode current beyond the predefined configuration in each of the first and second differential lines.

4. The PCB as claimed in claim 1, wherein the dielectric capacitance allows the common-mode current to flow as the backward current.

5. The PCB as claimed in claim 1, wherein the first and second differential lines in the predefined configuration are each arranged in one of a spiral, square, hexagon or pentagon structure.

6. The PCB as claimed in claim 1, wherein the PCB is single-layered, double-layered or multi-layered.

7. A method in a Printed Circuit Board (PCB) for reducing a common-mode current, comprising:
    forming first and second differential lines, the first differential line on a first plane of the PCB and the second differential line a second plane of the PCB different than the first plane, in a predetermined configuration,
    wherein the first and second differential lines are configured to carry a differential mode current and the common mode current, the differential mode current and the common mode current being at least one of a forward current and a backward current,
    wherein the first and second differential lines generate an impedance at the predefined configuration and generate a dielectric capacitance,
    wherein flow of the forward current and the backward current in adjacent tracks of each of the first and second differential lines in the predefined configuration are in opposite directions, and
    wherein flow of the backward current in adjacent tracks of each of the first and second differential lines in the predefined configuration are in opposite directions.

8. The method as claimed in claim 7, wherein a common mode choke is formed by placing a permeability material in between the adjacent tracks of at least one of the first and second differential lines.

9. The method as claimed in claim 7, wherein flow of the common-mode current beyond the predefined configuration in each of the first and second differential lines is restricted by the impedance.

10. The method as claimed in claim 7, wherein the common-mode current is allowed to flow as the backward current by the dielectric capacitance.

11. The method as claimed in claim 7, wherein the first and second differential lines in the predefined configuration are each arranged in one of a spiral, square, hexagon or pentagon structure.

12. The method as claimed in claim 7, wherein the PCB is single-layered, double-layered or multi-layered.

* * * * *